United States Patent
Goto

(10) Patent No.: US 6,744,252 B2
(45) Date of Patent: Jun. 1, 2004

(54) MAGNETIC FIELD CORRECTING METHOD, MAGNETIC FIELD GENERATING APPARATUS, AND MAGNETIC RESONANCE IMAGING APPARATUS

(75) Inventor: Takao Goto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/643,609

(22) Filed: Aug. 19, 2003

(65) Prior Publication Data

US 2004/0041567 A1 Mar. 4, 2004

(30) Foreign Application Priority Data

Aug. 27, 2002 (JP) ........................................ 2002-246401

(51) Int. Cl.[7] ................................................. G01V 3/00
(52) U.S. Cl. ........................ 324/320; 324/319; 335/296
(58) Field of Search ................................. 324/320, 319, 324/318, 300, 306, 307, 309; 335/296, 299, 304; 600/410

(56) References Cited

U.S. PATENT DOCUMENTS

| | | | |
|---|---|---|---|
| 4,644,313 A | | 2/1987 | Miyajima |
| 5,347,252 A | * | 9/1994 | Ries ............................ 335/299 |
| 5,534,779 A | * | 7/1996 | Young et al. ................ 324/319 |
| 6,265,960 B1 | * | 7/2001 | Schauwecker et al. ...... 335/301 |
| 6,362,623 B1 | | 3/2002 | Goto |
| 6,373,251 B1 | * | 4/2002 | Damadian et al. .......... 324/318 |
| 6,529,003 B2 | | 3/2003 | Goto et al. |
| 6,621,267 B1 | * | 9/2003 | Damadian et al. .......... 324/319 |

\* cited by examiner

*Primary Examiner*—Louis M. Arana
(74) *Attorney, Agent, or Firm*—Carl B. Horton, Esq.; Armstrong Teasdale LLP

(57) ABSTRACT

For the purpose of efficiently correcting a quadratic term component of a static magnetic field, when an inhomogeneity error of a static magnetic field generated by a pair of magnets supported by yokes so that the magnets face each other across a space is to be corrected, a quadratic term component of the static magnetic field is corrected by a quadratic term component of a magnetic field generated by a pair of circular loop coils, and a zero-th order term component of the magnetic field from the pair of circular loop coils is compensated by a zero-th order term component of a magnetic field generated by coils wound around the yokes.

16 Claims, 4 Drawing Sheets

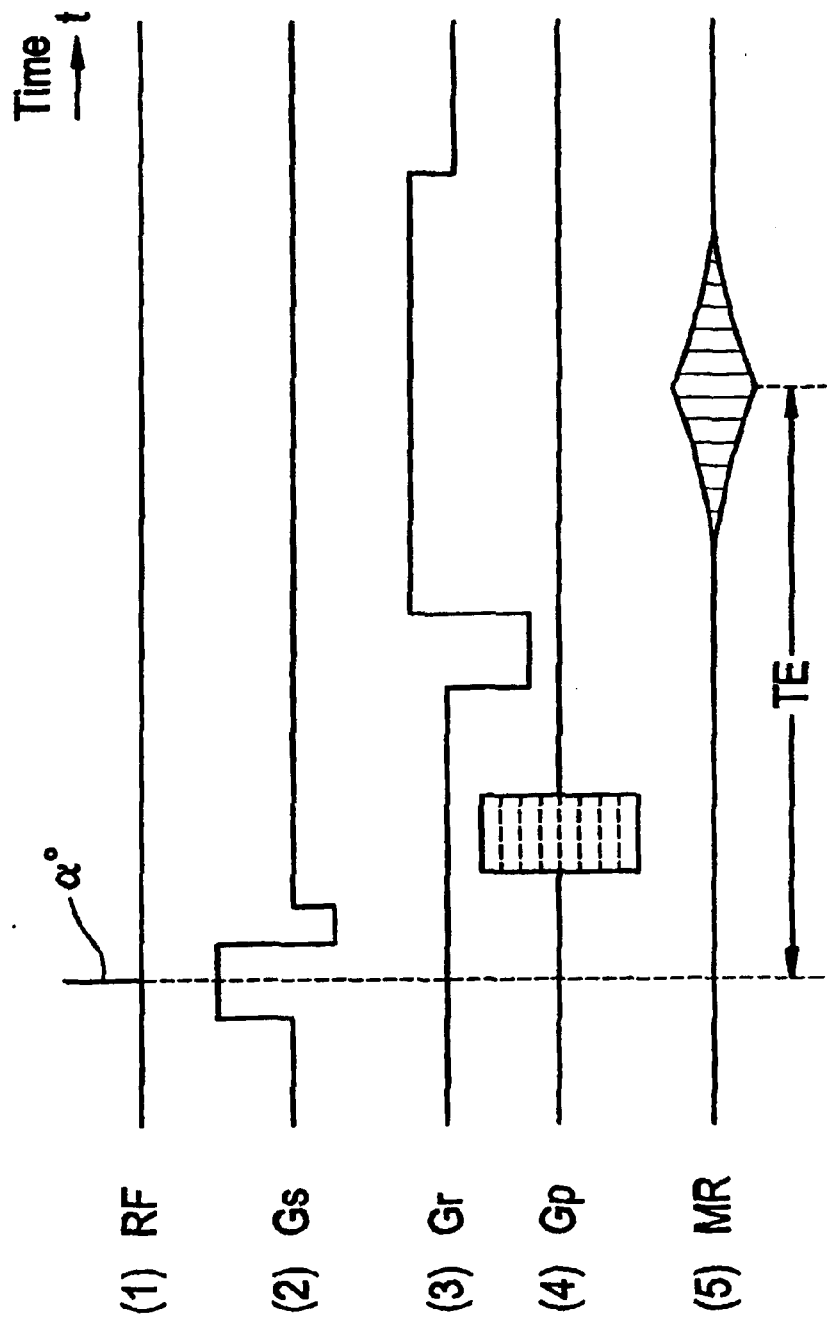

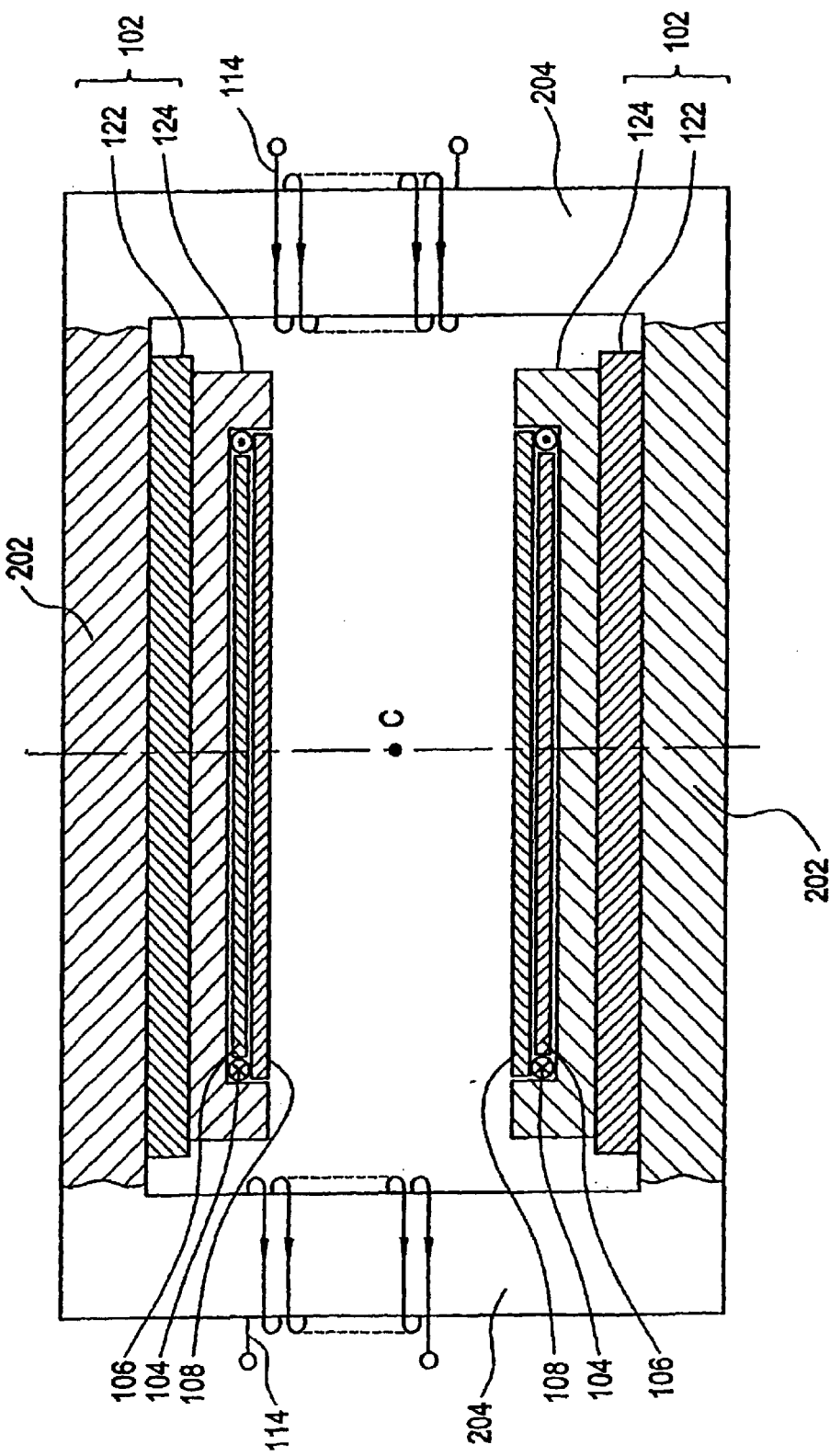

MAGNETIC FIELD CORRECTING METHOD, MAGNETIC FIELD GENERATING APPARATUS, AND MAGNETIC RESONANCE IMAGING APPARATUS

CROSS REFERENCE TO RELATED APPLICATION

This application claims the benefit of Japanese Application No. 2002-246401 filed Aug. 27, 2002.

BACKGROUND OF THE INVENTION

The present invention relates to a magnetic field correcting method, magnetic field generating apparatus, and magnetic resonance imaging apparatus, and more particularly to a method of correcting an inhomogeneity error of a static magnetic field generated by a pair of magnets that are supported by yokes so that the magnets face each other across a space, an apparatus for generating a static magnetic field of which an inhomogeneity error is corrected, and a magnetic resonance imaging apparatus comprising such a magnetic field generating apparatus.

In a conventional apparatus for generating a homogeneous static magnetic field in a space by a pair of magnets facing each other, two pairs of circular loop coils disposed symmetrically with respect to a center of the static magnetic field space are employed to cancel (correct) a quadratic term component of the static magnetic field by quadratic term components of magnetic fields generated by the circular loop coil pairs. The magnetic fields generated by the two pairs of circular loop coils are made to have opposite polarities to reduce the effect of their zero-th order term components on the static magnetic field.

In such a conventional method, since the polarities of the magnetic fields generated by the two pairs of circular loop coils are opposite to each other, the quadratic term component of the static magnetic field is corrected by the difference between the quadratic term components of the magnetic fields from the circular loop coil pairs. Accordingly, efficiency of the correction is poor considering the power supplied to the two pairs of circular loop coils.

SUMMARY OF THE INVENTION

It is therefore an object of the present invention to provide a method of efficiently correcting a quadratic term component of a static magnetic field, an apparatus for generating a static magnetic field of which a quadratic term component is efficiently corrected, and a magnetic resonance imaging apparatus comprising such a magnetic field generating apparatus.

(1) The present invention, in accordance with one aspect thereof for solving the aforementioned problem, is a magnetic field correcting method for correcting an inhomogeneity error of a static magnetic field generated in a space by a pair of magnets that are supported by yokes so that the magnets face each other across said space, characterized in comprising: correcting a quadratic term component of said static magnetic field by a quadratic term component of a magnetic field generated in said space by a pair of circular loop coils disposed in said space symmetrically with respect to a center of said space; and compensating a zero-th order term component of the magnetic field in said space from said pair of circular loop coils by a zero-th order term component of a magnetic field generated in said space by a coil wound around at least one of said yokes.

(2) The present invention, in accordance with another aspect thereof for solving the aforementioned problem, is a magnetic field generating apparatus characterized in comprising: magnetic field generating means having a pair of magnets that are supported by yokes so that the magnets face each other across a space, for generating a static magnetic field in said space; correcting means for correcting a quadratic term component of said static magnetic field by a quadratic term component of a magnetic field generated in said space by a pair of circular loop coils disposed in said space symmetrically with respect to a center of said space; and compensating means for compensating a zero-th order term component of the magnetic field in said space from said pair of circular loop coils by a zero-th order term component of a magnetic field generated in said space by a coil wound around at least one of said yokes.

(3) The present invention, in accordance with still another aspect thereof for solving the aforementioned problem, is a magnetic resonance imaging apparatus characterized in comprising: magnetic field generating means having a pair of magnets that are supported by yokes so that the magnets face each other across a space, for generating a static magnetic field in said space; correcting means for correcting a quadratic term component of said static magnetic field by a quadratic term component of a magnetic field generated in said space by a pair of circular loop coils disposed in said space symmetrically with respect to a center of said space; compensating means for compensating a zero-th order term component of the magnetic field in said space from said pair of circular loop coils by a zero-th order term component of a magnetic field generated in said space by a coil wound around at least one of said yokes; signal acquiring means for acquiring magnetic resonance signals generated by spins in said space; and image producing means for producing an image based on said acquired magnetic resonance signals.

In the invention of the aforementioned aspects, when an inhomogeneity error of a static magnetic field generated by a pair of magnets that are supported by yokes so that the magnets face each other across a space is to be corrected, a quadratic term component of the static magnetic field is corrected by a quadratic term component of a magnetic field generated by a pair of circular loop coils disposed symmetrically with respect to a center of the static magnetic field space, and a zero-th order term component of the magnetic field from the pair of circular loop coils is compensated by a zero-th order term component of a magnetic field generated by a coil wound around at least one of the yokes.

Since the quadratic term component of the magnetic field generated by the coil wound around the yoke is significantly smaller than the quadratic term component of the magnetic field generated by the pair of circular loop coils, the correction effect by the pair of circular loop coils on the quadratic term component is not diminished. Thus, the quadratic term component of the static magnetic field is efficiently corrected. At the same time, the effect of the zero-th order term component of the magnetic field from the pair of circular loop coils on the static magnetic field is appropriately eliminated.

Preferably, sensing means for sensing the magnetic field in said space from said pair of circular loop coils, and control means for controlling said compensating means based on said sensed magnetic field are included so that the zero-th order term component may be properly corrected.

Preferably, a pair of gradient coils for imparting a gradient to the static magnetic field in said space is provided on pole surfaces of said pair of magnets, and said pair of circular loop coils is provided along outer peripheries of said pair of gradient coils so that increase of the distance between the magnets due to the provision of the pair of loop coils may be reduced.

Preferably, said yokes comprise at least one vertical yoke and a pair of horizontal yokes facing each other horizontally extending from ends of said vertical yoke so that the static magnetic field space may be appropriately formed.

Preferably, said pair of magnets is provided on opposing surfaces of said pair of horizontal yokes when a vertical magnetic field is to be generated.

Preferably, the magnets of said pair each have a pole piece so that homogeneity of the magnetic field may be improved.

Preferably, said at least one vertical yoke comprises a pair of yokes symmetric with respect to the center of said space so that the horizontal yokes may be doubly supported.

Preferably, said coil is wound around said vertical yoke so that the magnetic field for correcting the zero-th order term component may be appropriately generated.

Therefore, the present invention can provide a method of efficiently correcting a quadratic term component of a static magnetic field, an apparatus for generating a static magnetic field of which a quadratic term component is efficiently corrected, and a magnetic resonance imaging apparatus comprising such a magnetic field generating apparatus.

Further objects and advantages of the present invention will be apparent from the following description of the preferred embodiments of the invention as illustrated in the accompanying drawings.

BRIEF DESCRIPTION OF THE DRAWINGS

FIG. 3 shows a pulse sequence for imaging.

FIG. 4 shows a configuration of a magnet system.

DETAILED DESCRIPTION OF THE INVENTION

Figure 1:
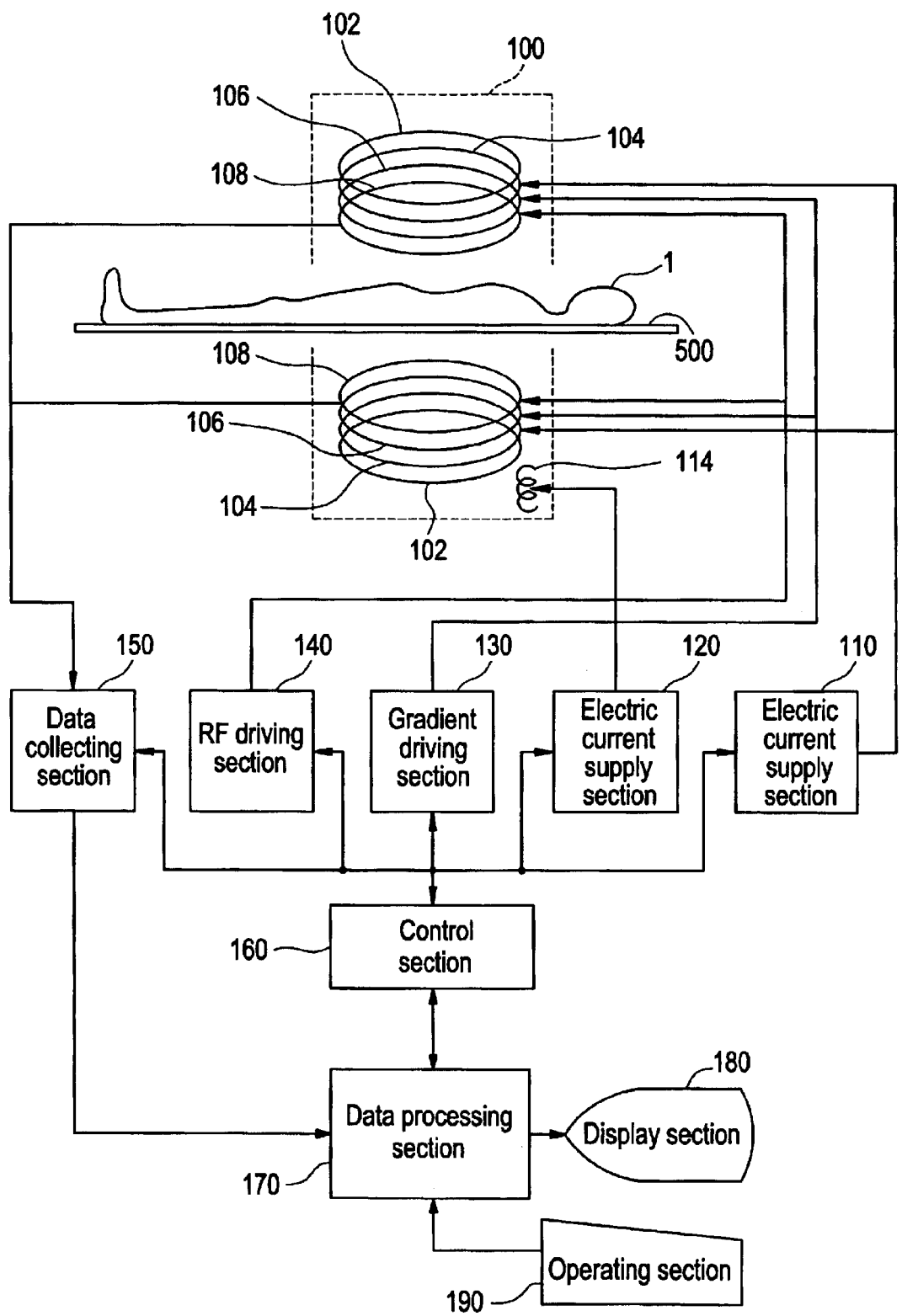
FIG. 1 is a block diagram of an apparatus in accordance with one embodiment of the present invention.

Embodiments of the present invention will now be described in detail with reference to the accompanying drawings. FIG. 1 shows a block diagram of a magnetic resonance image apparatus. The apparatus is an embodiment of the present invention. The configuration of the apparatus represents an embodiment of the magnetic resonance imaging apparatus in accordance with the present invention.

As shown in FIG. 1, the present apparatus has a magnet system 100. The magnet system 100 has a main magnetic field magnet section 102, a correcting coil section 104, a gradient coil section 106, an RF coil section 108, and a compensating coil section 114. A subject to be imaged 1 is rested on a table 500 and carried into and out of an internal space (bore) of the magnet system 100.

The main magnetic field magnet section 102, correcting coil section 104, gradient coil section 106, and RF coil section 108 each comprise a pair of members facing each other across a space. They each have a generally circular outer periphery and are disposed to have a common center axis. The magnet system 100 will be described in detail later.

The main magnetic field magnet section 102 generates a static magnetic field in the internal space of the magnet system 100. The direction of the static magnetic field is generally orthogonal to the direction of the body axis of the subject 1. That is, a magnetic field commonly referred to as a vertical magnetic field is generated. The main magnetic field magnet section 102 is made using permanent magnets, for example. The main magnetic field magnet section 102 is not limited to the permanent magnets, but may be made using super or normal conductive electromagnets or the like.

The correcting coil section 104 generates a magnetic field for correcting quadratic inhomogeneity of the static magnetic field. Specifically, the correcting coil section 104 generates a magnetic field containing a quadratic term component equal to a quadratic term component of the static magnetic field in an opposite polarity.

The gradient coil section 106 generates three gradient magnetic fields for imparting gradients to the static magnetic field strength in directions of three mutually perpendicular axes, i.e., a slice axis, a phase axis, and a frequency axis.

The gradient magnetic field in the slice axis direction is sometimes referred to as the slice gradient magnetic field. The gradient magnetic field in the phase axis direction is sometimes referred to as the phase encoding gradient magnetic field. The gradient magnetic field in the frequency axis direction is sometimes referred to as the readout gradient magnetic field. In order to enable generation of such gradient magnetic fields, the gradient coil section 106 has three gradient coils, which will be described later. The gradient magnetic field will be sometimes referred to simply as the gradient hereinbelow.

The RF coil section 108 transmits an RF (radio frequency) pulse to the static magnetic field space for exciting spins within the subject 1. The RF coil section 108 also receives magnetic resonance signals generated by the excited spins. The RF coil section 108 may be a type that conducts transmission and reception by the same coil or a type that conducts transmission and reception by separate coils.

The compensating coil section 114 generates a magnetic field for compensating a zero-th order term component of the magnetic field generated by the correcting coil section 104. Specifically, the compensating coil section 114 generates a magnetic field having a zero-th order term component equal to a zero-th order term component of the magnetic field generated by the correcting coil section 104 in an opposite polarity.

The correcting coil section 104 is connected with an electric current supply section 110. The electric current supply section 110 supplies electric current to the correcting coil section 104 to generate the corrective magnetic field. The compensating coil section 114 is connected with an electric current supply section 120. The electric current supply section 120 supplies electric current to the compensating coil section 114 to generate the compensative magnetic field.

The gradient coil section 106 is connected with a gradient driving section 130. The gradient driving section 130 supplies driving signals to the gradient coil section 106 to generate the gradient magnetic fields. The gradient driving section 130 has three driving circuits, which are not shown, corresponding to the three gradient coils in the gradient coil section 106.

The RF coil section 108 is connected with an RF driving section 140. The RF driving section 140 supplies driving signals to the RF coil section 108 to transmit the RF pulse, thereby exciting the spins within the subject 1.

The RF coil section 108 is connected with a data collecting section 150. The data collecting section 150 gathers receive signals received by the RF coil section 108 by sampling them, and collects the signals as digital data.

The electric current supply sections 110 and 120, gradient driving section 130, RF driving section 140 and data collecting section 150 are connected with a control section 160. The control section 160 controls the electric current supply sections 110 and 120 to correct inhomogeneity of the static magnetic field. The control section 160 also controls the gradient driving section 130, RF driving section 140 and data collecting section 150 to carry out imaging.

The control section 160 is, for example, constituted using a computer. The control section 160 has a memory, which is not shown. The memory stores programs for the control section 160 and several kinds of data. The function of the control section 160 is implemented by the computer executing a program stored in the memory.

A portion including the gradient coil section 106, RF coil section 108, gradient driving section 130, RF driving section 140 and data collecting section 150 is an embodiment of the signal acquiring means of the present invention.

The output of the data collecting section 150 is connected to a data processing section 170. Data collected by the data collecting section 150 is input to the data processing section 170. The data processing section 170 is, for example, constituted using a computer. The data processing section 170 has a memory, which is not shown. The memory stores programs for the data processing section 170 and several kinds of data.

The data processing section 170 is connected to the control section 160. The data processing section 170 is above the control section 160 and controls it. The function of the present apparatus is implemented by the data processing section 170 executing a program stored in the memory.

The data processing section 170 stores the data collected by the data collecting section 150 into the memory. A data space is established in the memory. The data space constitutes a two-dimensional Fourier space. The Fourier space will be sometimes referred to as a k-space hereinbelow. The data processing section 170 performs a two-dimensional inverse Fourier transformation on the data in the k-space to reconstruct an image of the subject 1. The data processing section 170 is one embodiment of the image producing means of the present invention.

The data processing section 170 is connected with a display section 180 and an operating section 190. The display section 180 comprises a graphic display, etc. The operating section 190 comprises a keyboard, etc., provided with a pointing device.

The display section 180 displays the reconstructed image and several kinds of information output from the data processing section 170. The operating section 190 is operated by a user, and it inputs several commands, information and so forth to the data processing section 170. The user interactively operates the present apparatus via the display section 180 and operating section 190.

Figure 2:
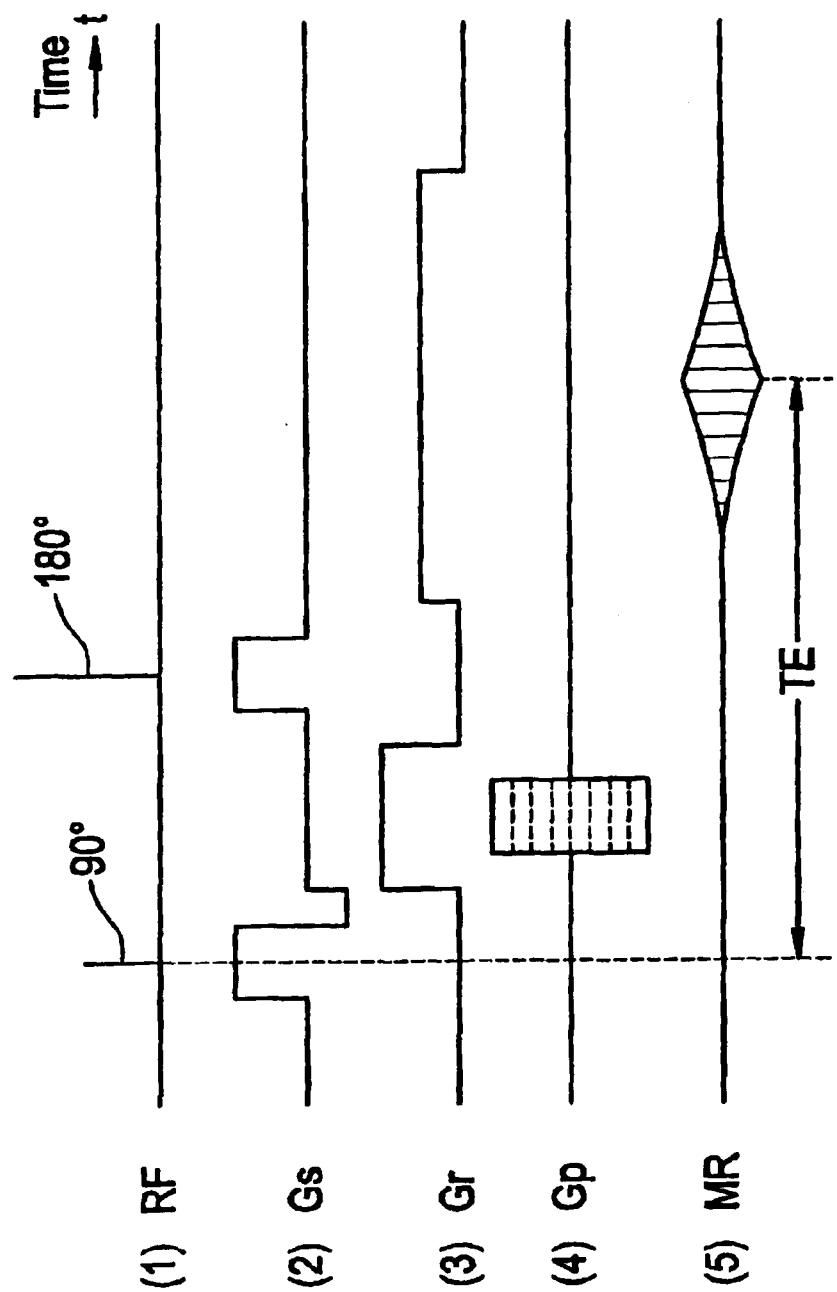
FIG. 2 shows a pulse sequence for imaging.

FIG. 2 shows an exemplary pulse sequence for use in magnetic resonance imaging. The pulse sequence is one according to a spin echo technique.

Specifically, FIG. 2(1) is a sequence of 90° and 180° pulses for RF excitation according to the SE technique, and (2), (3), (4), and (5) are sequences of a slice gradient Gs, readout gradient Gr, phase encoding gradient Gp, and spin echo MR, respectively, according to the SE technique. The 90° and 180° pulses are represented by their respective center signals. The pulse sequence proceeds along a time axis t from the left to the right.

As shown, the 90° pulse achieves 90° excitation of the spins. At that time, a slice gradient Gs is applied to perform selective excitation of a certain slice. After a certain time from the 90° excitation, 180° excitation, i.e., spin inversion, is achieved by the 180° pulse. Again, at that time, a slice gradient Gs is applied to perform selective inversion of the same slice.

In the period between the 90° excitation and spin inversion, a readout gradient Gr and a phase encoding gradient Gp are applied. The readout gradient Gr dephases the spins. The phase encoding gradient Gp phase-encodes the spins.

After the spin inversion, the spins are rephased by the readout gradient Gr to cause a spin echo MR to be generated. The spin echo MR is collected by the data collecting section 150 as view data. Such a pulse sequence is repeated 64–512 times in a cycle TR (repetition time). The phase encoding gradient Gp is changed for each repetition to effect different phase encodings each time. Thus, view data are obtained for 64–512 views.

Another example of the pulse sequence for magnetic resonance imaging is shown in FIG. 3. This pulse sequence is one according to a GRE (gradient echo) technique.

Specifically, FIG. 3(1) is a sequence of an $\alpha°$ pulse for RF excitation according to the GRE technique, and (2), (3), (4), and (5) are sequences of a slice gradient Gs, readout gradient Gr, phase encoding gradient Gp, and gradinet echo MR, respectively, according to the GRE technique. The $\alpha°$ pulse is represented by its central value. The pulse sequence proceeds along a time axis t from the left to the right.

As shown, the $\alpha°$ pulse achieves $\alpha°$ excitation of the spins. $\alpha$ is 90 or less. At that time, a slice gradient Gs is applied to perform selective excitation of a certain slice.

After the $\alpha°$ excitation, phase encoding of the spins is achieved by the phase encoding gradient Gp. Next, the spins are first dephased and subsequently rephased by the readout gradient Gr to cause a gradient echo MR to be generated. The gradient echo MR is collected by the data collecting section 150 as view data. Such a pulse sequence is repeated 64–512 times in a cycle TR. The phase encoding gradient Gp is changed for each repetition to effect different phase encodings each time. Thus, view data are obtained for 64–512 views.

The view data acquired by the pulse sequence shown in FIG. 2 or 3 are collected in the memory in the data processing section 170. The pulse sequence is not limited to one according to the SE or GRE technique, and it will be easily recognized that a pulse sequence according to any other appropriate technique such as a fast spin echo (FSE) technique or echo planar imaging (EPI) may be employed. The data processing section 170 reconstructs an image based on the view data collected in the memory.

FIG. 4 schematically shows a configuration of the magnet system 100 in a partial cross-sectional view. The apparatus is an embodiment of the present invention. The configuration of the apparatus represents an embodiment of the magnetic field generating apparatus in accordance with the present invention. A static magnetic field correcting method applied to the present apparatus represents an embodiment of the magnetic field correcting method in accordance with the present invention.

As shown, the magnet system 100 has a pair of horizontal yokes 202 and a pair of vertical yokes 204. The horizontal yokes 202 have a generally plate-like outer shape. FIG. 4 shows their thickness. The vertical yokes 204 have a generally columnar outer shape. FIG. 4 shows their thickness. A portion including the pair of horizontal yokes 202 and the pair of vertical yokes 204 is an embodiment of the yokes of the present invention.

The horizontal yokes 202 are supported facing each other across a space by the pair of vertical yokes 204. By such a configuration of the horizontal yokes, a static magnetic field space can be appropriately formed. The yokes are made of a magnetic material such as soft iron, and they form a magnetic circuit for magnets described below. It should be noted that one of the vertical yokes 204 may be omitted. However, the configuration of the horizontal yokes doubly supported by the pair of vertical yokes facilitates structural strengthening.

The opposing surfaces of the horizontal yokes 202 are provided with magnets 122. The magnets 122 have a generally disk-like outer shape. FIG. 4 shows their thickness. The magnets 122 are magnetized in their thickness direction to have the same polarity. The vertical magnetic field is thus generated.

The magnets 122 are permanent magnets, for example. The magnets 122 constitute an embodiment of the magnets of the present invention. A portion including the pair of horizontal yokes 202, pair of vertical yokes, and pair of magnets 122 is an embodiment of the magnetic field generating means of the present invention.

Poles of the magnets 122 that lie on the sides opposite to the horizontal yokes 202 are each provided with pole pieces 124. The pole pieces 124 are made of a magnetic material such as soft iron, and they serve as magnetism conditioning plates for the magnets 122 to homogenize the static magnetic field. The pole pieces 124 also have a generally disk-like outer shape, and FIG. 4 shows their thickness. Each of the pole pieces 124 has a periphery protruding away from the magnet 122, and a portion surrounded by the protrusion forms a depression of each pole piece 124. The pole pieces 124 constitute an embodiment of the pole pieces of the present invention.

The depression of each of the pole piece 124 receives the correcting coil section 104, gradient coil section 106 and RF coil section 108. The gradient coil section 106 and RF coil section 108 are stacked with the gradient coil section 106 underneath. The gradient coil section 106 is an embodiment of the gradient coil of the present invention.

The correcting coil section 104 is provided along the periphery of the gradient coil section 106 surrounding the periphery. The correcting coil section 104 comprises a circular loop coil that is disposed concentrically with the gradient coil section 106. The correcting coil section 104 is an embodiment of the pair of circular loop coils of the present invention. The correcting coil section 104 will be sometimes referred to as the circular loop coil(s) hereinbelow.

By disposing the circular loop coils 104 as described above, the thickness of the circular loop coils 104 can be absorbed in the thickness of the gradient coil section 106. Thus, an increase of the pole-to-pole distance due to the provision of the circular loop coils 104 is avoided. An increase of the pole-to-pole distance creates a need for a stronger magnet to obtain a magnetic field having the same strength; however, no such need arises because increase of the pole-to-pole distance is avoided.

The circular loop coils 104 are disposed symmetrically with respect to a center of the static magnetic field space, i.e., the magnet center C. The circular loop coils 104 carry electric current in the same polarity supplied by the electric current supply section 110. The value of the electric current is adjusted to cancel a quadratic term component of the static magnetic field. A portion including the circular loop coils 104 and electric current supply section 110 is an embodiment of the correcting means of the present invention.

The compensating coil section 114 comprises a pair of solenoid coils wound around the pair of vertical yokes 204 in the magnet system 100. The compensating coil section will be sometimes referred to as the solenoid coil(s) hereinbelow.

The solenoid coils 114 generate a magnetomotive force in the vertical yokes 204 by electric current supplied by the electric current supply section 120. A magnetic field based on the magnetomotive force is generated in the static magnetic field space. By winding the solenoid coils 114 around the vertical yokes, the magnetic field resulting from the magnetomotive force can be properly generated in the static magnetic field space.

The direction of the electric current through the solenoid coils 114 is determined so that the magnetic field has a polarity opposite to the magnetic field generated by the circular loop coils 104. Moreover, the electric current value is determined so that a zero-th order term component of the magnetic field resulting from the magnetomotive force by the solenoid coils 114 equals a zero-th order term component of the magnetic field by the circular loop coils 104. Thus, the effect of the zero-th order term component of the magnetic field from the circular loop coils 104 on the static magnetic field is eliminated. A portion including the solenoid coils 114 and electric current supply section 120 is an embodiment of the compensating means of the present invention.

Even if the effect of the zero-th order term component on the static magnetic field cannot completely be eliminated, problems can be easily avoided insofar as the effect falls within a range that can be handled by adjusting the frequency of the RF pulse. A linear term component can be corrected by the gradient magnetic field generated by the gradient coil section 106.

As for the quadratic term component, since the quadratic term component of the magnetic field generated in the static magnetic field space via the yokes by the magnetomotive force of the solenoid coils 114 is significantly smaller than the quadratic term component of the magnetic field from the circular loop coils 104, the former quadratic term component does not affect the correction on the quadratic term component of the static magnetic field by the circular loop coils 104. Therefore, the quadratic term component correction of the static magnetic field is efficiently achieved by the circular loop coils 104.

Homogeneity of the static magnetic field may vary due to a change in the ambient temperature, a temporal change in characteristics or the like. In such a case, homogeneity is controlled by controlling the electric current supply sections 110 and 120 via the control section 160 under management by the data processing section 170.

In the homogeneity control, inhomogeneity of the static magnetic field is first estimated. The inhomogeneity is estimated by the data processing section 170 from a phase map of spins in the static magnetic field space or the like. The phase map is created from an image captured by magnetic resonance imaging on the subject 1 or a reference object. The inhomogeneity of the static magnetic field thus estimated is corrected by modifying the current supplied to the circular loop coils 104 to a new value.

The zero-th order term component changes with the modification of the electric current. Since the change of the zero-th order term component is reflected on the phase map captured for confirming the correction effect, the electric current supplied to the solenoid coils 114 is adjusted based thereon to eliminate the effect of the change of the zero-th order term component. This properly achieves removal of the zero-th order term component.

The data processing section 170 that senses the change of the zero-th order term component based on the phase map is an embodiment of the sensing means of the present invention. The control section 160 that adjusts the electric current at the electric current supply section 120 based on the sensing result is an embodiment of the control means of the present invention.

While the present invention has been described with reference to preferred embodiments hereinabove, various changes or substitutions may be made on these embodiments by those ordinarily skilled in the art pertinent to the present invention without departing from the technical scope of the present invention. Therefore, the technical scope of the present invention encompasses not only those embodiments described above but all that fall within the scope of the appended claims.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic field correcting method for correcting an inhomogeneity error of a static magnetic field generated in a space by a pair of magnets that are supported by yokes so that the magnets face each other across said space, comprising the steps of:

correcting a quadratic term component of said static magnetic field by a quadratic term component of a magnetic field generated in said space by a pair of circular loop coils disposed in said space symmetrically with respect to a center of said space; and compensating a zero-th order term component of the magnetic field in said space from said pair of circular loop coils by a zero-th order term component of a magnetic field generated in said space by a coil wound around at least one of said yokes.

2. A magnetic field generating apparatus comprising:

a magnetic field generating device having a pair of magnets that are supported by yokes so that the magnets face each other across a space, for generating a static magnetic field in said space;

a correcting device for correcting a quadratic term component of said static magnetic field by a quadratic term component of a magnetic field generated in said space by a pair of circular loop coils disposed in said space symmetrically with respect to a center of said space; and a compensating device for compensating a zero-th order term component of the magnetic field in said space from said pair of circular loop coils by a zero-th order term component of a magnetic field generated in said space by a coil wound around at least one of said yokes.

3. The magnetic field generating apparatus of claim 2, wherein a pair of gradient coils for imparting a gradient to the static magnetic field in said space is provided on pole surfaces of said pair of magnets, and said pair of circular loop coils is provided along outer peripheries of said pair of gradient coils.

4. The magnetic field generating apparatus of claim 2, wherein said yokes comprise at least one vertical yoke and a pair of horizontal yokes facing each other horizontally extending from ends of said vertical yoke.

5. The magnetic field generating apparatus of claim 4, wherein said pair of magnets is provided on opposing surfaces of said pair of horizontal yokes.

6. The magnetic field generating apparatus of claim 5, wherein said pair of magnets each have a pole piece.

7. The magnetic field generating apparatus of claim 4, wherein said at least one vertical yoke comprises a pair of yokes symmetric with respect to the center of said space.

8. The magnetic field generating apparatus of claim 4, wherein said coil is wound around said vertical yoke.

9. A magnetic resonance imaging apparatus comprising:

a magnetic field generating device having a pair of magnets that are supported by yokes so that the magnets face each other across a space, for generating a static magnetic field in said space;

a correcting device for correcting a quadratic term component of said static magnetic field by a quadratic term component of a magnetic field generated in said space by a pair of circular loop coils disposed in said space symmetrically with respect to a center of said space;

a compensating device for compensating a zero-th order term component of the magnetic field in said space from said pair of circular loop coils by a zero-th order term component of a magnetic field generated in said space by a coil wound around at least one of said yokes;

a signal acquiring device for acquiring magnetic resonance signals generated by spins in said space; and an image producing device for producing an image based on said acquired magnetic resonance signals.

10. The magnetic resonance imaging apparatus of claim 9, further comprising:

a sensing device for sensing the magnetic field in said space from said pair of circular loop coils; and a control device for controlling said compensating device based on said sensed magnetic field.

11. The magnetic resonance imaging apparatus of claim 9, wherein a pair of gradient coils for imparting a gradient to the static magnetic field in said space is provided on pole surfaces of said pair of magnets, and said pair of circular loop coils is provided along outer peripheries of said pair of gradient coils.

12. The magnetic resonance imaging apparatus of claim 9, wherein said yokes comprise at least one vertical yoke and a pair of horizontal yokes facing each other horizontally extending from ends of said vertical yoke.

13. The magnetic resonance imaging apparatus of claim 12, wherein said pair of magnets is provided on opposing surfaces of said pair of horizontal yokes.

14. The magnetic resonance imaging apparatus of claim 13, wherein said pair of magnets each have a pole piece.

15. The magnetic resonance imaging apparatus of claim 12, wherein said at least one vertical yoke comprises a pair of yokes symmetric with respect to the center of said space.

16. The magnetic resonance imaging apparatus of claim 12, wherein said coil is wound around said vertical yoke.

* * * * *